United States Patent [19]
Matsuura

[11] Patent Number: 5,940,341
[45] Date of Patent: Aug. 17, 1999

[54] SEMICONDUCTOR MEMORY DEVICE

[75] Inventor: Yoshiaki Matsuura, Nara, Japan

[73] Assignee: Sharp Kabushiki Kaisha, Osaka, Japan

[21] Appl. No.: 08/991,363

[22] Filed: Dec. 15, 1997

[30] Foreign Application Priority Data

Mar. 19, 1997 [JP] Japan ................................. 9-067065

[51] Int. Cl.⁶ ........................................................ G11C 8/00
[52] U.S. Cl. ............................ 365/230.01; 365/230.06; 365/104; 365/154
[58] Field of Search ............................. 365/230.01, 230.03, 365/230.06, 194, 104, 94, 154

[56] References Cited

U.S. PATENT DOCUMENTS 5,440,506  8/1995  Longway et al. ...................... 365/104
5,764,586  6/1998  Vanco et al. ......................... 365/230.06

OTHER PUBLICATIONS

Japanese Laid–Open Publication No. 4–53095. Laid open on Feb. 20, 1992. (English Abstract included).

*Primary Examiner*—Huan Hoang
*Attorney, Agent, or Firm*—Morrison & Foerster, LLP

[57] ABSTRACT

In a semiconductor memory device including a plurality of memory cells, in which when an address of any one of the memory cells is input, data is read out from the memory cell corresponding to the address so as to be output, the semiconductor memory device includes null addresses having no corresponding memory cells; and predetermined data is output in response to input of the null addresses.

3 Claims, 6 Drawing Sheets

SEMICONDUCTOR MEMORY DEVICE

BACKGROUND OF THE INVENTION

1. Field of the Invention

The present invention relates to a semiconductor memory device including a plurality of memory cells, in which data can be written into these memory cells and data can be read out from these memory cells. More specifically, the present invention relates to a semiconductor memory device capable of performing a read only operation for a part of data.

2. Description of the Related Art

For example, a liquid crystal display device includes a liquid crystal panel, liquid crystal drivers, A/D converter, an image memory (semiconductor memory device) and the like. A picture signal is input to the A/D converter, and an image data output from the A/D converter is once stored in the image memory. The image data in the image memory is supplied to the liquid crystal driver so as to drive the liquid crystal panel, thereby displaying the image in a display screen of the liquid crystal panel.

In order to protect liquid crystals in the liquid crystal panel, even when no picture signal is input and no image data exist in the image memory, the liquid crystal panel must be kept driven by supplying high-level or low-level data to the liquid crystal driver.

Therefore, the image memory stores predetermined read only data which is to be supplied to the liquid crystal driver when no image data exist, and the data can be read out any time. Thus, the image memory includes not only a memory area where writing and reading of data are possible, but also a memory area where reading of data is only possible.

Figure 4:
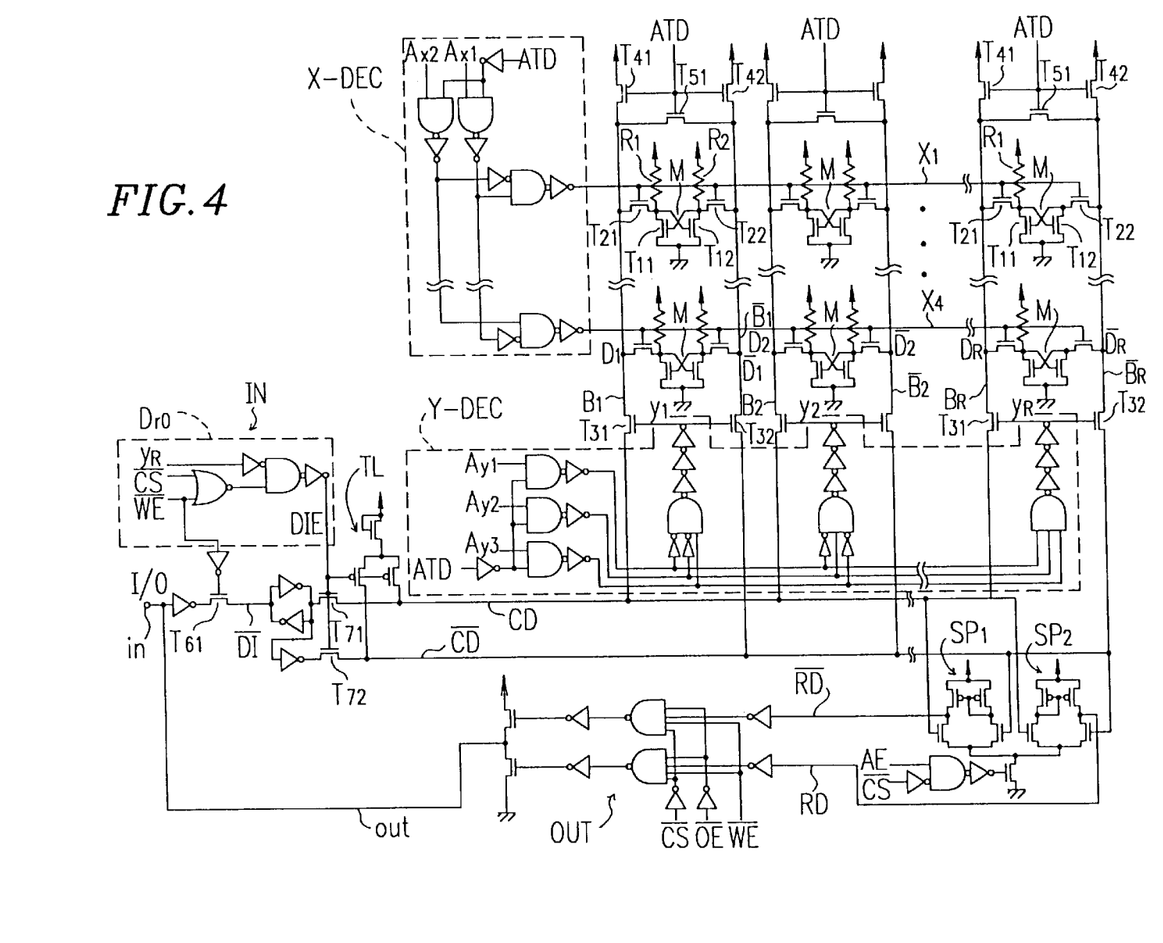
FIG. 4 is a circuit diagram illustrating a conventional semiconductor memory device.

A static random access memory (SRAM) as shown in FIG. 4 is one example of such semiconductor devices. In FIG. 4, memory cells M are disposed in a matrix of 4×R (row×column). Each of the memory cells M includes a pair of load resistances R1 and R2 connected to a power supply voltage (not shown), a pair of N channel transistors T11 and T12 for holding data, and a pair of N channel transistors T21 and T22 for inputting and outputting data. Sources of the N channel transistors T11 and T12 for holding data are grounded. Drains and gates of the transistors T11 and T12 are cross-coupled. These N channel transistors T11 and T12 are operated complementarily. When data is supplied through the N channel transistors T21 and T22, the N channel transistors T11 and T12 continue to hold the data.

In each of the memory cells M in the Rth column, the load resistance R2 is omitted. As a result, a high-level potential is retained by the N channel transistor T11, and a low-level potential is retained by the N channel transistor T12, thereby fixing the data in each of the memory cells M in the Rth column.

In other words, each of the memory cells M in the Rth column serves as a read only memory (ROM), and each memory cell M in the columns other than the Rth column serves as a RAM.

Word signal lines X1 to X4 are provided along the rows in a matrix arrangement of the memory cells M, respectively. For each row, the word signal line is connected to a gate of each of the N channel transistors T21 and T22 in each of the memory cells M.

Along the columns, bit signal lines B1 to BR and /B1 to /BR are provided, respectively. For each of the columns, a pair of bit signal lines B and /B are connected to drains of the N channel transistors T21 and T22 in each of the memory cells M, respectively. For each of the columns, the pair of the bit signal lines B and /B are connected to common data signal lines CD and /CD through column selecting transistors T31 and T32, respectively. For each of the columns, current is supplied to the pair of the bit signal lines B and /B through load transistors T41 and T42, respectively.

Figure 5:
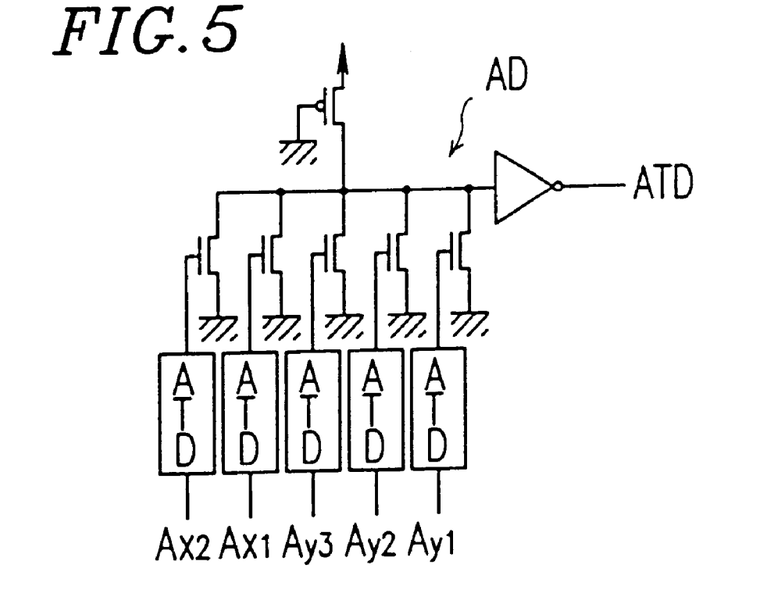
FIG. 5 is a circuit diagram illustrating an address generating circuit connected to the device shown in FIG. 4.

Moreover, for each of the columns, the pair of the bit signal lines B and /B are connected to each other via a transistor T51. Prior to writing of data into each of the memory cells M and reading of data out from each of the memory cells M, an address transition detecting signal ATD from an address generating circuit AD shown in FIG. 5 is supplied to a gate of the transistor T51. The transistor T51 is temporarily turned ON, thereby equalizing charges in each of the bit signal lines B and /B.

A row decoder X-DEC inputs address signals Ax1 and Ax2 for designating rows of the matrix arrangement from the address generating circuit AD shown in FIG. 5. The row decoder X-DEC selects the rows in a sequential manner so that the word signal lines X1 to X4 are sequentially switched to and set at a high level. Every time each of the word signal lines X1 to X4 is switched to be high level in a sequential manner, N channel transistors T21 and T22 in each of the memory cells M in the corresponding row are turned ON through the word signal line. As a result, for each of the memory cells M, data signals D and /D are transmitted from the respective N channel transistors T11 and T12 to the respective bit signal lines B and /B.

A column decoder Y-DEC inputs address signals Ay1, Ay2, and Ay3 for designating columns of the matrix arrangement from the address generating circuit AD shown in FIG. 5. The column decoder Y-DEC selects each of the columns in a sequential manner so that column selecting signals y are supplied to gates of the column selecting transistors T31 and T32 in the selected column, thereby turning ON these column selecting transistors T31 and T32. When column selecting transistors T31 and T32 in the selected column are turned ON, the data signals D and /D on the bit signal lines B and /B are transmitted to the common data signal lines CD and /CD.

Current is supplied to the common data signal lines CD and /CD through a group of load transistors TL.

Figure 6:
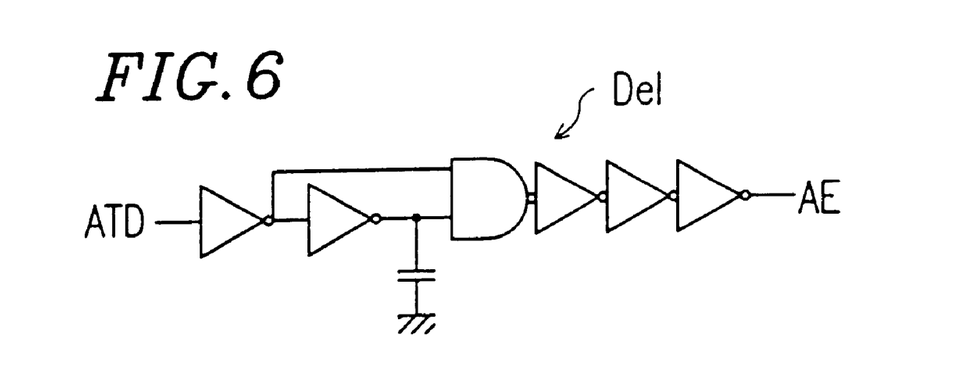
FIG. 6 is a circuit diagram illustrating a delay circuit connected to the device shown in FIG. 4.

Each of sense amplifiers SP1 and SP2 responds to a delay address transition detecting signal AE from a delay circuit Del (shown in FIG. 6). As a result, differential amplification of the data signals D and /D on the common data signal lines CD and /CD is performed so as to output these data signals D and /D to read data signal lines RD and /RD.

An output circuit OUT forms a data signal DOUT from data signals D and /D on the read data signal lines RD and /RD, and outputs the data signal DOUT to an output signal line out.

An input circuit IN includes an operation driving unit Dr0 for driving a transferring transistor T61 and coupling transistors T71 and T72. The transferring transistor T61 is turned ON or OFF in response to a write enabling signal /WE and connects an input terminal in to a write data signal line /DI. The coupling transistors T71 and T72 are turned ON or OFF in response to a column selecting signal yR in the last column of the matrix arrangement, i.e., the Rth column, and the write enabling signal /WE. The coupling transistors T71 and T72 connect the write data signal line /DI to the common data signal lines CD and /CD.

Figure 7:
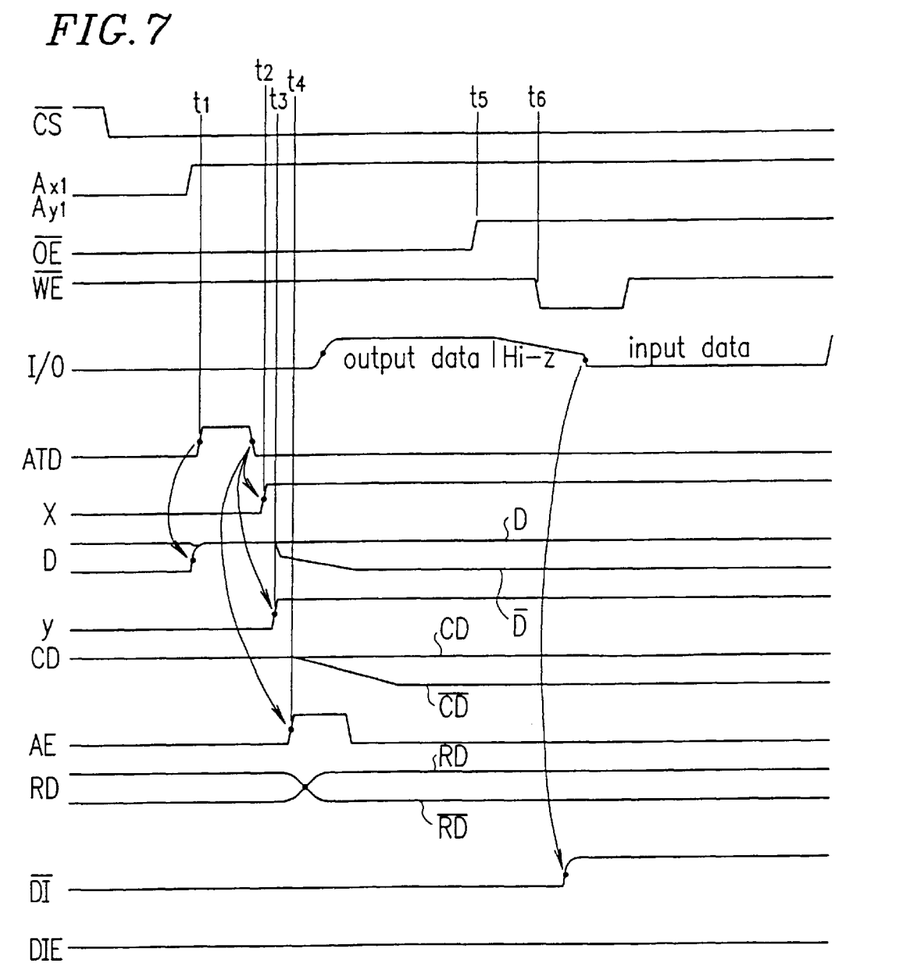
FIG. 7 is a timing chart illustrating a timing of each of signals in the device shown in FIG. 4.

A timing of each of the signals in the above-described semiconductor memory device will be described with reference to FIG. 7 and the circuit diagram of FIG. 4. As can be seen from FIG. 7, an initiation signal /CS is made to be low level so that the sense amplifiers SP1, SP2, the output circuit OUT and the input circuit IN are made to be in an operatable state.

Under this condition, when each of the address signals Ax1, Ax2, Ay1, Ay2, and Ay3 is generated, the address transition detecting signal ATD becomes high level for a predetermined period of time from a point t1. As a result, for each column, the pair of bit signal lines B and /B are connected to each other via the transistor T51, thereby equalizing charges of the bit signal lines B and /B.

At a point t2, the row decoder X-DEC makes one of the word signal lines X1 to X4 high level in response to the address signals Ax1 and Ax2. For each memory cell M in one row, the row decoder X-DEC outputs the data signals D and /D from the memory cell M to the bit signal lines B and /B.

At a point t3 which is slightly after the point t2, the column decoder Y-DEC selects one of the columns of the matrix arrangement in response to the address signals Ay1, Ay2, and Ay3. The column selecting signals y are supplied to the column selecting transistors T31 and T32 in the selected column so that these column selecting transistors are turned ON and the data signals D and /D on the bit signal lines B and /B are transmitted to the common data signal lines CD and /CD.

Moreover, at a point t4, differential amplification of the data signals D and /D on the common data signal lines CD and /CD is performed by the sense amplifiers SP1 and SP2 in response to the delay address transition detecting signal AE so as to output these data signals D and /D to the read data signal lines RD and /RD. These data signals D and /D are output to the output signal line out as a data signal DOUT via the output circuit OUT.

Such a data reading operation is also performed when the address of each memory cell M in the Rth column is generated. The data signals D and /D in the each memory cell M in the Rth column are transmitted to the bit signal lines B and /B, the common data signal lines CD and /CD, the read data signal lines RD and /RD, and the output signal line out in a sequential manner.

On the other hand, when data is written, an out enabling signal /OE becomes high level at a point t5, thereby inhibiting the operation of the output circuit OUT. For a predetermined period of time from a point t6, the write enabling signal /WE is kept at a low level so that the transferring transistor T61 of the input circuit IN is turned ON. As a result, the input terminal in is connected to the write data signal line /DI. At this time, if the memory cells M in the columns other than the Rth column are designated, the column selecting signal yR designating the Rth column becomes low level, and a write data enabling signal DIE becomes high level. As a result, the coupling transistors T71 and T72 in the input circuit IN are turned ON so that the write data signal line /DI is connected to the common data signal lines CD and /CD. Consequently, the data signal is introduced from the input terminal in to the common data signal lines CD and /CD, thereby enabling the writing of data.

However, if each of the memory cells M in the Rth column, which serves as a ROM, is designated and the column selecting signal yR is high level, the write data enabling signal DIE becomes low level. As a result, the coupling transistors T71 and T72 in the input circuit IN are turned OFF, thereby blocking data signals from the input terminal in.

However, since the above-described conventional semiconductor memory device partially contains the memory cells M in a less-frequently-used Rth column, i.e., ROMs, the area occupied by the memory cells M of the semiconductor memory device is increased.

SUMMARY OF THE INVENTION

According to one aspect of this invention, in a semiconductor memory device including a plurality of memory cells, in which when an address of any one of the memory cells is input, data is read out from the memory cell corresponding to the address so as to be output, the semiconductor memory device includes null addresses having no corresponding memory cells; and predetermined data is output in response to input of the null addresses.

In one embodiment of the present invention, the memory cells are arranged in a matrix, and each of addresses and null addresses of the memory cells is represented by a position in the matrix arrangement.

According to another aspect of this invention, in a semiconductor memory device including: a plurality of memory cells disposed in a matrix; a plurality of word signal lines disposed along respective rows in the matrix arrangement for selecting the memory cells in a block of each of the rows; and a plurality of bit signal lines disposed along respective columns of the matrix arrangement for selecting the memory cells in a block of each of the columns, wherein any one of the memory cells is accessed through each of the word signal lines and each of the bit signal lines and data is retrieved from the accessed memory cell through the bit signal line so as to be output, a null area having no memory cells is provided in each of the rows or each of the columns of the matrix arrangement; and predetermined date is output when the null area is accessed through the each word signal line and the each bit signal line.

In one embodiment of the present invention, the semiconductor memory device further includes: a common data signal line connected to each of the bit signal lines via each of column selecting switches; a decoding means for inputting a null address designating a null area and decoding the null address; and a driving means for driving the common data signal line either at a high level or a low level in response to an output of the decoding means. Data is read out from the common data signal line to outside of the semiconductor memory device.

In another embodiment of the present invention, the semiconductor memory device further includes: a write data signal line inserted between a data input terminal and a common data signal line; a transferring switch inserted between the data input terminal and the write data signal line, for connecting and disconnecting the data input terminal and the write data signal line; a decoding means for inputting a null address designating a null area and decoding the null address; a driving means for driving the write data signal line either at a high level or a low level in response to an output of the decoding means; and a coupling switch inserted between the write data signal line and the common data signal line, for connecting the write data signal line and the common data signal line in response to an output of a delayed decoding means.

According to such a structure, although a null address has no corresponding memory cell, since data is output in response to the input of the null address, the memory cells M can be reduced in number and thus the occupied area and cost of the memory cells M can be reduced.

According to such a structure, although a null area has no memory cells, data is output when the null area is accessed. Accordingly, the memory cells M can be reduced in number and thus, the occupied area and cost of the memory cells can be reduced.

Thus, the invention described herein makes possible the advantage of providing a semiconductor memory device outputting read only data while omitting memory cells serving as ROMs which are less frequently used.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of an illustrative, but non-limiting example with reference to the accompanying figures.

Figure 1:
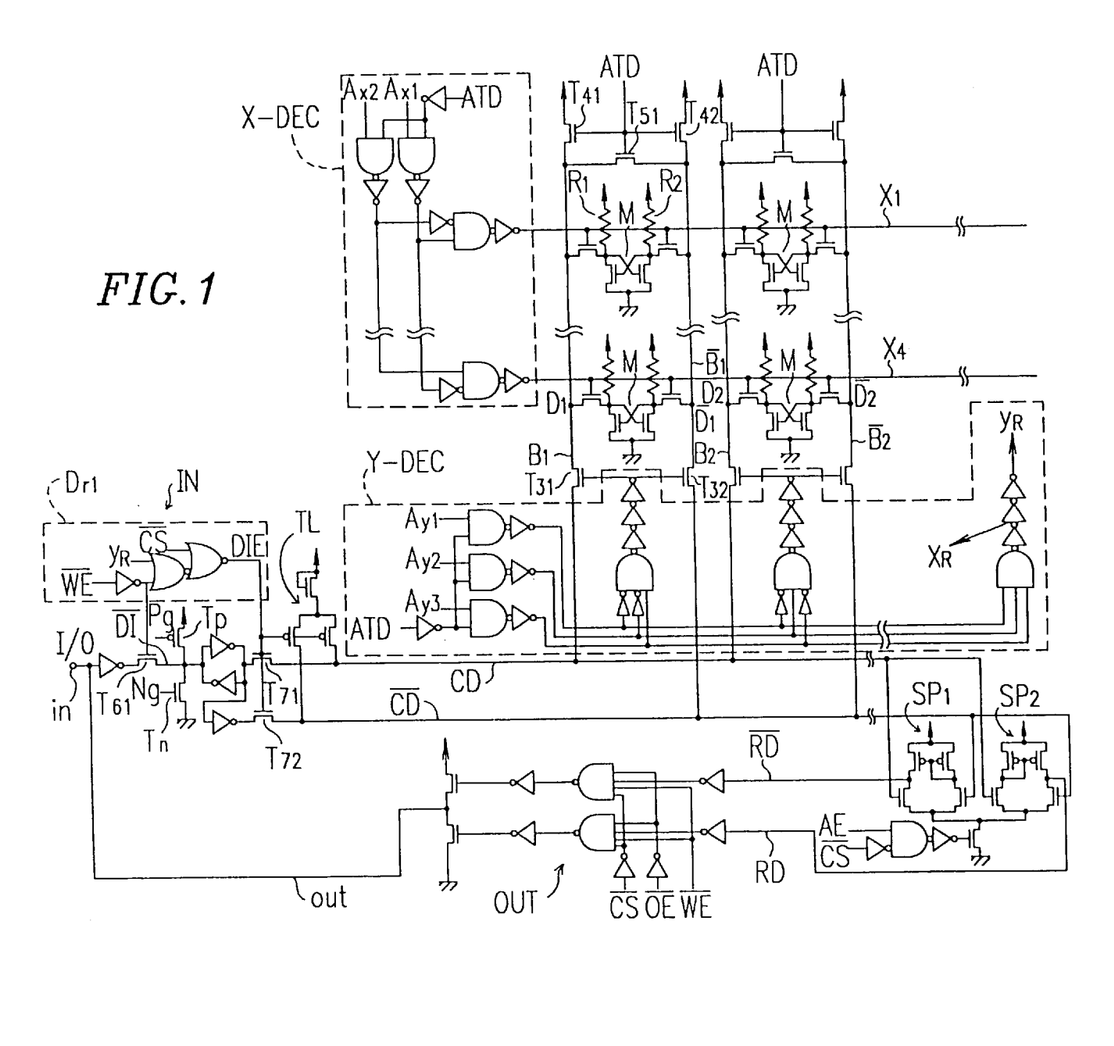
FIG. 1 is a circuit diagram illustrating one example of a semiconductor memory device according to the present invention.
Figure 2:
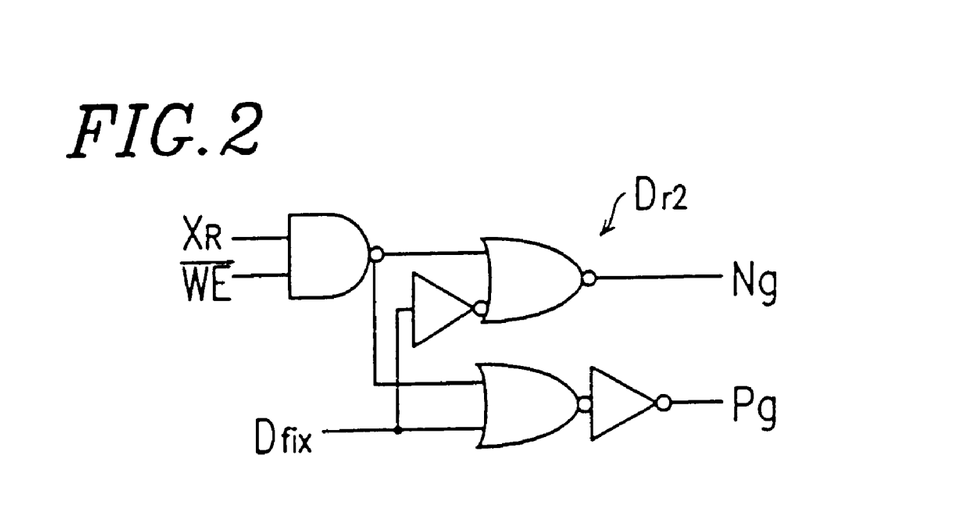
FIG. 2 is a circuit diagram illustrating a second operation driving unit connected to the device shown in FIG. 1.

FIG. 1 illustrates one example of a semiconductor memory device of the present invention. According to the device of this example, the memory cells M in the Rth column in the device shown in FIG. 4 are omitted. Accordingly, the bit signal lines BR and /BR, the column selecting transistors T31 and T32, the load transistors T41 and T42, and the transistor T51 in the Rth column are also omitted. Moreover, a first operation driving unit Dr1 is provided in stead of the operation driving unit Dr0 in the input circuit IN of the device shown in FIG. 4. Furthermore, a pair of P channel transistor Tp and N channel transistor Tn are sequentially connected in an input circuit IN. A write data signal line /DI is connected to a middle point between the transistors Tp and Tn. In order to drive the P channel transistor Tp and the N channel transistor Tn, a second operation driving unit Dr2 as shown in FIG. 2 is included.

In the semiconductor memory device having such a structure, an operation for reading data out from the memory cells M in the columns other than the Rth column and an operation for writing data into the memory cells M are performed in the same manner as those in the device of the FIG. 4. An operation regarding the memory cells M in the Rth column is different from that in the device of FIG. 4. The operation will be described with reference to a timing chart in FIG. 3 and the circuit diagram of FIG. 1.

Figure 3:
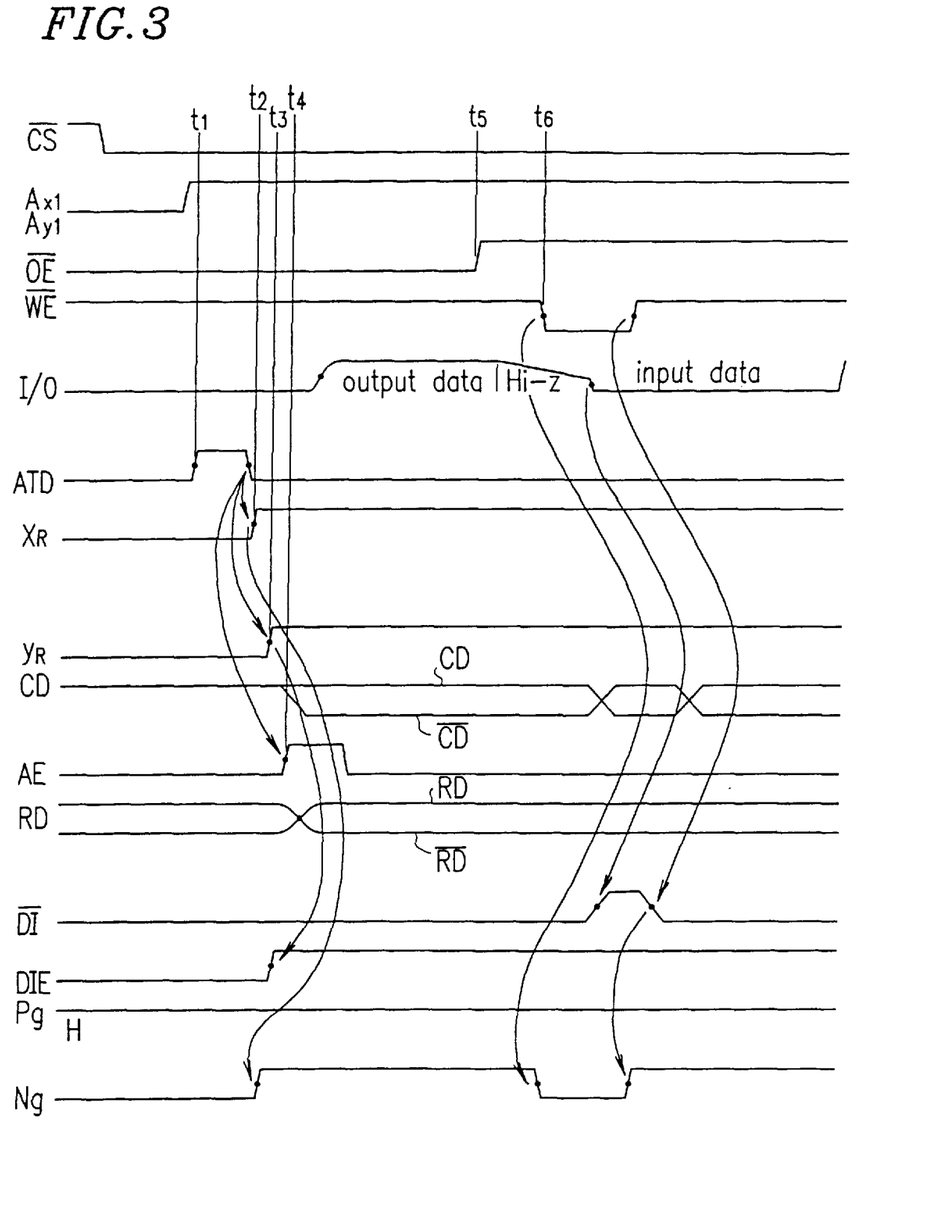
FIG. 3 is a timing chart illustrating a timing of each of signals in the device shown in FIG. 1.

First, an initiation signal /CS is set at a low level so that sense amplifiers SP1 and SP2, an output circuit OUT, and the input circuit IN are made to be in an operatable state. Under this condition, if each of address signals Ax1, Ax2, Ay1, Ay2, and Ay3 designating the memory cells M in the Rth column is generated, an address transition detecting signal ATD becomes high level for a predetermined period of time from a point t1. As a result, for every column, a pair of bit signal lines B and /B are connected to each other via a transistor T51, thereby equalizing charges of the bit signal lines B and /B.

A row decoder X-DEC subsequently selects one of word signal lines X1 to X4 in response to the address signals Ax1 and Ax2. However, since the memory cells M in the Rth column are designated, the operation of the row decoder X-DEC is not necessary.

In response to the address signals Ay1, Ay2, and Ay3, a column decoder Y-DEC selects the Rth column so that a high-level column selecting signal xR is output at a point t2 and a high-level column selecting signal yR designating the Rth column is output at a point t3 which is slightly after the point t2.

The column selecting signal xR is supplied to a second operation driving unit Dr2 shown in FIG. 2. In addition to the column selecting signal xR, the second operation driving unit Dr2 inputs a write enabling signal /WE and a read only data signal Dfix, and outputs driving signals Pg and Ng. The driving signals Pg and Ng are supplied to the P channel transistor Tp and the N channel transistor Tn.

For example, if the data signal Dfix is previously set at a high level, the second operation driving unit Dr2 supplies the high-level driving signal Pg to the P channel transistor Tp. Also, from the point t2 where the column selecting signal xR is turned to be high level, the second operation driving unit Dr2 supplies the high level driving signal Ng to the N channel transistor Tn.

Thus, the P channel transistor Tp continues to maintain an OFF state, whereas the N channel transistor Tn maintains an ON state from the point t2. Consequently, the write data signal line /DI is set at a low level.

Subsequently, when the high level column selecting signal yR is supplied to the first operation driving unit Dr1 in the input circuit IN, the first operation driving unit Dr1 outputs the high level write enabling signal DIE. As a result, the coupling transistors T71 and T72 are turned ON, and the write data signal line /DI is connected to the common data signal lines CD and /CD.

At this point, the common data signal lines CD and /CD are set to the data signals Dfix and /Dfix in response to the low level in the write data signal line /DI.

Moreover, at a point t4, the sense amplifiers SP1 and SP2 perform differential amplification of the data signals Dfix and /Dfix on the common data signal lines CD and /CD so as to output these data signals Dfix and /Dfix to the read data signal lines RD and /RD. These data signals Dfix and /Dfix are output to an output signal line out as a data signal DOUT via an output circuit OUT.

In this manner, if addressing of the Rth column in the matrix arrangement occurs, potential of the write data signal line /DI is set in accordance with the data signal Dfix and the coupling transistors T71 and T72 are turned ON. As a result, the data signals Dfix and /Dfix are transmitted from the write data signal line /DI to the common data signal lines CD and /CD so as to be output.

Upon reading out data, since the write enabling signal /WE is at a high level, the transferring transistor T61 is turned OFF, thereby disconnecting an input terminal in from the write data signal line /DI. When the memory cells M in the columns other than the Rth column are addressed by the address signals Ax1, Ax2, Ay1, Ay2, and Ay3, the column selecting signal yR is at a low level, thereby making the write data enabling signal DIE low level. The coupling transistors T71 and T72 are turned OFF, thereby disconnecting the write data signal line /DI from the common data signal lines CD and /CD.

Next, if one intends to write data while addressing the memory cells M in the Rth column, an out enabling signal /OE becomes high level at a point t5, thereby inhibiting the operation of the output circuit OUT. For a predetermined period of time from a point t6, the write enabling signal /WE is at a low level. As a result, the transferring transistor T61 in the input circuit IN is turned ON so that the input terminal in is connected to the write data signal line /DI. At this point, the second operation driving unit Dr2 shown in FIG. 2 supplies the low-level driving signal Ng to the N channel transistor Tn in response to the low-level write enabling signal /WE. As a result, the N channel transistor Tn is turned OFF. Since no memory cells M exist in the Rth column, although the data in the input terminal in is transmitted to the write data signal line /DI, the common data signal lines CD and /CD, and the read data signal lines RD and /RD, in a sequential manner, the data cannot be written.

In the case where the data in the input terminal in is at a low level, even if the common data signal line CD becomes low level, the write enabling signal /WE is turned to be high level at the completion of the data writing. Thus, the second operation driving unit Dr2 supplies the high level driving signal Ng to the N channel transistor Tn so that the N channel transistor Tn is turned ON. As a result, the common data signal line CD returns to high level.

The present invention is not limited to the above-described example, but it can be modified in various ways. For example, as an area having no memory cells, a row of the matrix arrangement may be provided. Alternatively, an area covering a plurality of rows and a plurality of columns may be provided as an area having no memory cells. Or the present invention may be applied not only to SRAM but also DRAM or the like.

As described above, the semiconductor memory device according to the present invention includes null addresses having no corresponding memory cells. In response to input of these null addresses, predetermined data is output. Alternatively, a null area having no memory cells is provided in each row or each column of the matrix arrangement. When the null area is accessed through the word signal lines and the bit signal lines, predetermined data is output.

Although no memory cells exist as described above, if data is output when addressed, the memory cells M can be reduced in number, and thus the occupied area and the cost of the memory cells M can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
    a plurality of memory cells disposed in a matrix;
    a plurality of word signal lines disposed along respective rows in the matrix arrangement for selecting the memory cells in a block of each of the rows; and
    a plurality of bit signal lines disposed along respective columns of the matrix arrangement for selecting the memory cells in a block of each of the columns, in which any one of the memory cells is accessed through each of the word signal lines and each of the bit signal lines and data is retrieved from the accessed memory cell through the bit signal line so as to be output,
        wherein a null area having no memory cells is provided in each of the rows or each of the columns of the matrix arrangement, and predetermined data is output when the null area is accessed through the each word signal line and the each bit signal line;
    the semiconductor memory device further comprising:
    a common data signal line connected to each of the bit signal lines via each of column selecting switches;
    a write data signal line inserted between a data input terminal and a common data signal line;
    a transferring switch inserted between the data input terminal and the write data signal line, for connecting and disconnecting the data input terminal and the write data signal line;
    a plurality of column selecting switches for connecting each of bit signal line and the common data signal line; and
    a coupling switch for connecting the write data signal line and the common data signal line;
        wherein when a null area having no memory cells is accessed, the write data signal line is set either at a high level or a low level, the coupling switch for connecting the write data signal line and the common data signal line turns on, so that the data is read out from the common data signal line to outside of the semiconductor memory device; and
        when the memory cell is accessed, the column selecting switch for connecting each of bit signal line and the common data signal line, corresponding to the memory cell which is accessed turns on, so that the data is read out from the common data signal line via the sense amplifier to outside of the semiconductor memory device.

2. A semiconductor memory device according to claim 1, further comprising:
    a decoding means for inputting a null address designating a null area and decoding the null address;
    a driving means for driving the write data signal line either at a high level or a low level in response to an output of the decoding means.

3. A semiconductor memory device according to claim 1, further comprising:
    a decoding means for inputting a null address designating a null area and decoding the null address;
        wherein the coupling switch turns on and turns off in response to an output of a delayed decoding means.

* * * * *